US011847540B2

(12) United States Patent
Harris et al.

(10) Patent No.: US 11,847,540 B2
(45) Date of Patent: *Dec. 19, 2023

(54) GRAPH MODEL BUILD AND SCORING ENGINE

(71) Applicant: Visa International Service Association, San Francisco, CA (US)

(72) Inventors: Theodore D. Harris, San Francisco, CA (US); Yue Li, San Mateo, CA (US); Tatiana Korolevskaya, Mountain View, CA (US); Craig O'Connell, San Mateo, CA (US)

(73) Assignee: Visa International Service Association, San Francisco, CA (US)

( * ) Notice: Subject to any disclaimer, the term of this patent is extended or adjusted under 35 U.S.C. 154(b) by 171 days.

This patent is subject to a terminal disclaimer.

(21) Appl. No.: 17/460,919

(22) Filed: Aug. 30, 2021

(65) Prior Publication Data

US 2021/0390461 A1 Dec. 16, 2021

Related U.S. Application Data

(63) Continuation of application No. 15/639,094, filed on Jun. 30, 2017, now Pat. No. 11,138,516.

(51) Int. Cl.
*G06N 20/00* (2019.01)
*G06N 3/088* (2023.01)
(Continued)

(52) U.S. Cl.
CPC ............ *G06N 20/00* (2019.01); *G06F 16/355* (2019.01); *G06F 18/2323* (2023.01);
(Continued)

(58) Field of Classification Search
CPC ........ G06K 9/00; G06K 9/62; G06K 9/00973; G06K 9/6224; G06K 9/00986;
(Continued)

(56) References Cited

U.S. PATENT DOCUMENTS 7,092,941 B1 8/2006 Campos et al.
8,438,122 B1 5/2013 Breckenridge et al.
(Continued)

FOREIGN PATENT DOCUMENTS

CN 106446124 A 2/2017
WO 2017075346 A1 5/2017
(Continued)

OTHER PUBLICATIONS

Cazabet, Remy, Frederic Amblard, and Chihab Hanachi. "Detection of overlapping communities in dynamical social networks." 2010 IEEE second international conference on social computing. IEEE, 2010: 309-314. (Year: 2010).*

(Continued)

*Primary Examiner* — Kamran Afshar
*Assistant Examiner* — Randall K. Baldwin
(74) *Attorney, Agent, or Firm* — Kilpatrick Townsend & Stockton LLP

(57) ABSTRACT

Embodiments are directed to a method for accelerating machine learning using a plurality of graphics processing units (GPUs), involving receiving data for a graph to generate a plurality of random samples, and distributing the random samples across a plurality of GPUs. The method may comprise determining a plurality of communities from the random samples using unsupervised learning performed by each GPU. A plurality of sample groups may be generated from the communities and may be distributed across the GPUs, wherein each GPU merges communities in each sample group by converging to an optimal degree of similarity. In addition, the method may also comprise generating from the merged communities a plurality of subgraphs, dividing each sub-graph into a plurality of overlapping clusters, distributing the plurality of overlapping clusters (Continued)

across the plurality of GPUs, and scoring each cluster in the plurality of overlapping clusters to train an AI model.

20 Claims, 8 Drawing Sheets

(51) Int. Cl.
| | |
|---|---|
| *G06N 5/022* | (2023.01) |
| *G06N 3/044* | (2023.01) |
| *G06N 3/047* | (2023.01) |
| *G06N 5/01* | (2023.01) |
| *G06N 3/084* | (2023.01) |
| *G06N 3/08* | (2023.01) |
| *G06N 3/048* | (2023.01) |
| *G06F 16/35* | (2019.01) |
| *G06F 30/327* | (2020.01) |
| *G06V 10/94* | (2022.01) |
| *G06F 18/2323* | (2023.01) |
| *G06N 7/01* | (2023.01) |
| *G06F 16/33* | (2019.01) |
| *G06F 16/901* | (2019.01) |

(52) U.S. Cl.
CPC ........... *G06F 30/327* (2020.01); *G06N 3/044* (2023.01); *G06N 3/047* (2023.01); *G06N 3/088* (2013.01); *G06N 5/01* (2023.01); *G06N 5/022* (2013.01); *G06N 7/01* (2023.01); *G06V 10/94* (2022.01); *G06F 16/3346* (2019.01); *G06F 16/9024* (2019.01); *G06F 16/9027* (2019.01); *G06N 3/048* (2023.01); *G06N 3/08* (2013.01); *G06N 3/084* (2013.01); *G06V 10/955* (2022.01)

(58) Field of Classification Search
CPC .. G06F 30/327; G06F 16/355; G06F 16/3346; G06F 16/9024; G06F 17/50; G06N 3/04; G06N 3/08; G06N 3/0445; G06N 3/0472; G06N 3/084; G06N 3/088; G06N 3/0481; G06N 5/00; G06N 5/02; G06N 5/003; G06N 5/022; G06N 7/00; G06N 7/005; G06N 99/00; G06N 20/00

See application file for complete search history.

(56) References Cited

U.S. PATENT DOCUMENTS

| | | | |
|---|---|---|---|
| 8,473,431 B1 | 6/2013 | Mann et al. | |
| 8,489,632 B1 | 7/2013 | Breckenridge et al. | |
| 8,533,222 B2 | 9/2013 | Breckenridge et al. | |
| 9,087,161 B1 | 7/2015 | Diamond | |
| 11,138,516 B2* | 10/2021 | Harris | G06N 3/047 |
| 2005/0243087 A1 | 11/2005 | Aharon | |
| 2007/0288602 A1* | 12/2007 | Sundaresan | G06Q 30/06 709/219 |
| 2015/0030219 A1 | 1/2015 | Madabhushi et al. | |
| 2015/0324690 A1* | 11/2015 | Chilimbi | G06N 3/063 706/27 |
| 2015/0339570 A1* | 11/2015 | Scheffler | G06N 3/04 706/27 |
| 2016/0092774 A1* | 3/2016 | Wang | H04L 67/535 706/46 |
| 2016/0162913 A1* | 6/2016 | Linden | G06Q 30/0202 705/7.31 |
| 2016/0188713 A1* | 6/2016 | Green | H04L 51/52 707/738 |
| 2016/0360336 A1* | 12/2016 | Gross | H04W 4/025 |
| 2017/0124451 A1* | 5/2017 | Barham | G06N 20/00 |
| 2017/0124452 A1* | 5/2017 | Tucker | G06N 3/045 |
| 2017/0124454 A1* | 5/2017 | Vasudevan | G06N 3/045 |
| 2017/0132513 A1* | 5/2017 | Yu | G06N 3/045 |
| 2017/0206276 A1* | 7/2017 | Gill | G06F 16/285 |
| 2018/0329958 A1* | 11/2018 | Choudhury | G06F 16/2456 |

FOREIGN PATENT DOCUMENTS

| | | |
|---|---|---|
| WO | 2017075360 A1 | 5/2017 |
| WO | 2017075438 A1 | 5/2017 |
| WO | WO-2018151619 A1 * | 8/2018 ......... G06F 16/9024 |

OTHER PUBLICATIONS

Martinovič, Jan, et al. "Left-Right oscillate algorithm for community detection used in e-learning system." IFIP International Conference on Computer Information Systems and Industrial Management. Springer, Berlin, Heidelberg, 2012: 278-289 (Year: 2012).*
Coscia, Michele, et al. "Demon: a local-first discovery method for overlapping communities." Proceedings of the 18th ACM SIGKDD international conference on Knowledge discovery and data mining. 2012: 615-623 (Year: 2012).*
Yang, Jaewon, and Jure Leskovec. "Community-affiliation graph model for overlapping network community detection." 2012 IEEE 12th international conference on data mining. IEEE, 2012: 1170-1175 (Year: 2012).*
Pietilänen, Anna-Kaisa, and Christophe Diot. "Dissemination in opportunistic social networks: the role of temporal communities." Proceedings of the thirteenth ACM international symposium on Mobile Ad Hoc Networking and Computing. 2012: 165-174 (Year: 2012).*
Mastrostefano, Enrico, and Massimo Bernaschi. "Efficient breadth first search on multi-GPU systems." Journal of Parallel and Distributed Computing 73.9 (2013): 1292-1305. (Year: 2013).*
Teodoro, George, et al. "Approximate similarity search for online multimedia services on distributed CPU-GPU platforms." The VLDB Journal 23.3 (2014): 427-448. (Year: 2014).*
Coscia, Michele, et al. "Uncovering hierarchical and overlapping communities with a local-first approach." ACM Transactions on Knowledge Discovery from Data (TKDD) 9.1 (2014): 1-27. (Year: 2014).*
Chopade, Pravin, and Justin Zhan. "Structural and functional analytics for community detection in large-scale complex networks." Journal of Big Data 2.1 (2015): 1-28. (Year: 2015).*
Brugger, Christian, et al. "A custom computing system for finding similarties in complex networks." 2015 IEEE Computer Society Annual Symposium on VLSI. IEEE, 2015: 262-267 (Year: 2015).*
Abadi, Martín, et al. "Tensorflow: Large-scale machine learning on heterogeneous distributed systems." arXiv preprint arXiv:1603.04467 (2016): 1-19. (Year: 2016).*
Goldsborough, Peter. "A tour of tensorflow." arXiv preprint arXiv:1610.01178 (2016). (Year: 2016).*
Cukierski, William, Benjamin Hamner, and Bo Yang. "Graph-based features for supervised link prediction." The 2011 International joint conference on neural networks. IEEE, 2011. (Year: 2011).*
Shrivastava, Anshumali, and Ping Li. "A new space for comparing graphs." 2014 IEEE/ACM International Conference on Advances in Social Networks Analysis and Mining (ASONAM 2014). IEEE, 2014. (Year: 2014).*
Seis, Bella Martinez, and Xiaoou Li. "Topic hierarchy in social networks." 2014 IEEE International Conference on Systems, Man, and Cybernetics (SMC). IEEE, 2014. (Year: 2014).*
Goyal, Palash, and Emilio Ferrara. "Graph embedding techniques, applications, and performance: A survey." Knowledge-Based Systems 151 (2018): 78-94. (Year: 2018).*
EP18822779.7 , "Office Action", dated Mar. 14, 2022, 4 pages.
U.S. Appl. No. 15/639,094 , "Final Office Action", dated Feb. 1, 2021, 43 pages.
U.S. Appl. No. 15/639,094 , "Non-Final Office Action", dated Aug. 21, 2020, 31 pages.
U.S. Appl. No. 15/639,094 , "Notice of Allowance", dated Jun. 2, 2021, 15 pages.

(56) References Cited

OTHER PUBLICATIONS

Abadi et al., "TensorFlow: Large-Scale Machine Learning on Heterogeneous Distributed Systems", arXiv preprint arXiv:1603.04467, 2016, pp. 1-19.

Bindu et al., "Mining Social Networks for Anomalies: Methods and Challenges", Journal of Network and Computer Applications, vol. 68, Apr. 16, 2016, pp. 213-229.

Cazabet et al., "Detection of Overlapping Communities In Dynamical Social Networks", Institute of Electrical and Electronics Engineers Second International Conference on Social Computing, Feb. 1, 2021, pp. 309-314.

Chopade et al., "Structural And Functional Analytics for Community Detection in Large-Scale Complex Networks", Journal of Big Data, vol. 2, No. 1, 2015, pp. 1-28.

Coscia et al., "Demon: a Local-First Discovery Method for Overlapping Communities", Proceedings of the 18th ACM SIGKDD International Conference on Knowledge Discovery and Data Mining, 2012, pp. 615-623.

Coscia et al., "Uncovering Hierarchical and Overlapping Communities with a Local-First Approach", ACM Transactions on Knowledge Discovery from Data, vol. 9, No. 1, 2014, pp. 1-27.

EP18822779.7, "Extended European Search Report", dated Jun. 16, 2020, 8 pages.

Martinovic et al., "Left-Right Oscillate Algorithm for Community Detection Used in E-Learning System", International Conference on Financial Cryptography and Data Security, vol. 7564, Sep. 26, 2012, pp. 278-289.

Mastrostefano, "Efficient Breadth First Search on Multi-GPU Systems", Journal of Parallel and Distributed Computing, vol. 73, Issue 9, Sep. 2013, pp. 1292-1305.

PCT/US2018/038968, "International Preliminary Report on Patentability", dated Jan. 9, 2020, 8 pages.

PCT/US2018/038968, "International Search Report and Written Opinion", dated Oct. 26, 2018, 11 pages.

Pietilanen et al., "Dissemination in Opportunistic Social Networks: The Role of Temporal Communities", Proceedings of the thirteenth ACM International Symposium on Mobile Ad Hoc Networking and Computing, 2012, pp. 165-174.

Teodoro et al., "Approximate Similarity Search for Online Multimedia Services on Distributed CPU-GPU Platforms", The International Journal on Very Large Data Bases, vol. 23, No. 3, 2014, pp. 427-448.

Yang et al., "Community-Affiliation Graph Model for Overlapping Network Community Detection", Institute of Electrical and Electronics Engineers 12th International Conference on Data Mining, 2012, pp. 1170-1175.

CN201880046597.X, "Office Action", dated Jan. 5, 2023, 14 pages.

Li et al., "Modifying the DPClus algorithm for identifying protein complexes based on new topological structures", BMC Bioinformatics, Sep. 25, 2008, 16 pages.

\* cited by examiner

GRAPH MODEL BUILD AND SCORING ENGINE

CROSS-REFERENCES TO RELATED APPLICATIONS

This application is a Continuation Application of U.S. patent application Ser. No. 15/639,094, filed on Jun. 30, 2017, which is herein incorporated by reference in its entirety for all purposes.

BACKGROUND

In today's technological environment, machine learning continues to be an increasingly popular tool for solving problems. Specifically, machine learning can be a powerful tool for making predictions about data. With the advent of big data, trends may be readily found, and through training, a machine learning model may be built in order to more easily solve problems over time.

However, a number of issues regarding machine learning still persist. Specifically, training is often a very time consuming and lengthy process. For problems in which a lot of data must be processed in order for the model to learn, such as for real-time recommendations or the like, weeks of training may be required to generate an accurate model. Even then, patterns and trends may frequently change, thus making long duration training times useless for making current predictions. What is needed in the art, is a faster method for building and training a machine learning model.

Embodiments of the invention address these and other problems, individually and collectively.

BRIEF SUMMARY

Various embodiments are directed to a method for accelerating machine learning using a plurality of graphics processing units (GPUs). The method may comprise generating, by a central processing unit, an initial graph from a plurality of initial known data sets, determining a plurality of subgraphs from the initial graph and inputting, the plurality of subgraphs into a plurality of graphics processing units. The method may further comprise executing, in each of the plurality of graphics processing units, a learning process on a subgraph to identify communities within the subgraph, distributing, by the central processing unit, the communities to the plurality of graphics processing units, and executing, in each of the plurality of graphics processing units, a merge process for communities received by the graphics processing units based on similarity to produce a set of merged communities, the merged communities or derivatives of the merged communities being used to classify an unknown data set.

In one embodiment, the derivatives are trees formed from the merged communities, and the method further comprises forming, in each of the graphics processing units, trees from each of the merged communities. In one embodiment, the method further comprises calculating, in each of the plurality of graphics processing units, a normalized overlap score between two or more communities and merging the two or more communities based on the normalized overlap score, and gathering, by the central processing unit, the merged communities from each of the plurality of graphics processing units. In addition, the method may further comprise evaluating, by the central processing unit, a file size of the merged communities, and stopping or repeating the merge process based on the evaluated file size of the merged communities.

In another embodiment, the method further comprises applying the unknown data set to the merged communities or derivatives thereof to classify the unknown data set, calculating, in the each of the plurality of graphics processing units, a vector similarity score for the merged communities based on a comparison of the merged communities and an updated graph from the plurality of initial known data sets and a plurality of new known data sets, wherein the plurality of initial known data sets and plurality of new known data sets comprise a history of transactions conducted over a network.

Other embodiments are directed to systems, central processing units, graphics processing units, server computers, client computers, portable consumer devices, and computer readable media associated with methods described herein.

A better understanding of the nature and advantages of embodiments of the present invention may be gained with reference to the following detailed description and the accompanying drawings.

TERMS

Figure 1:
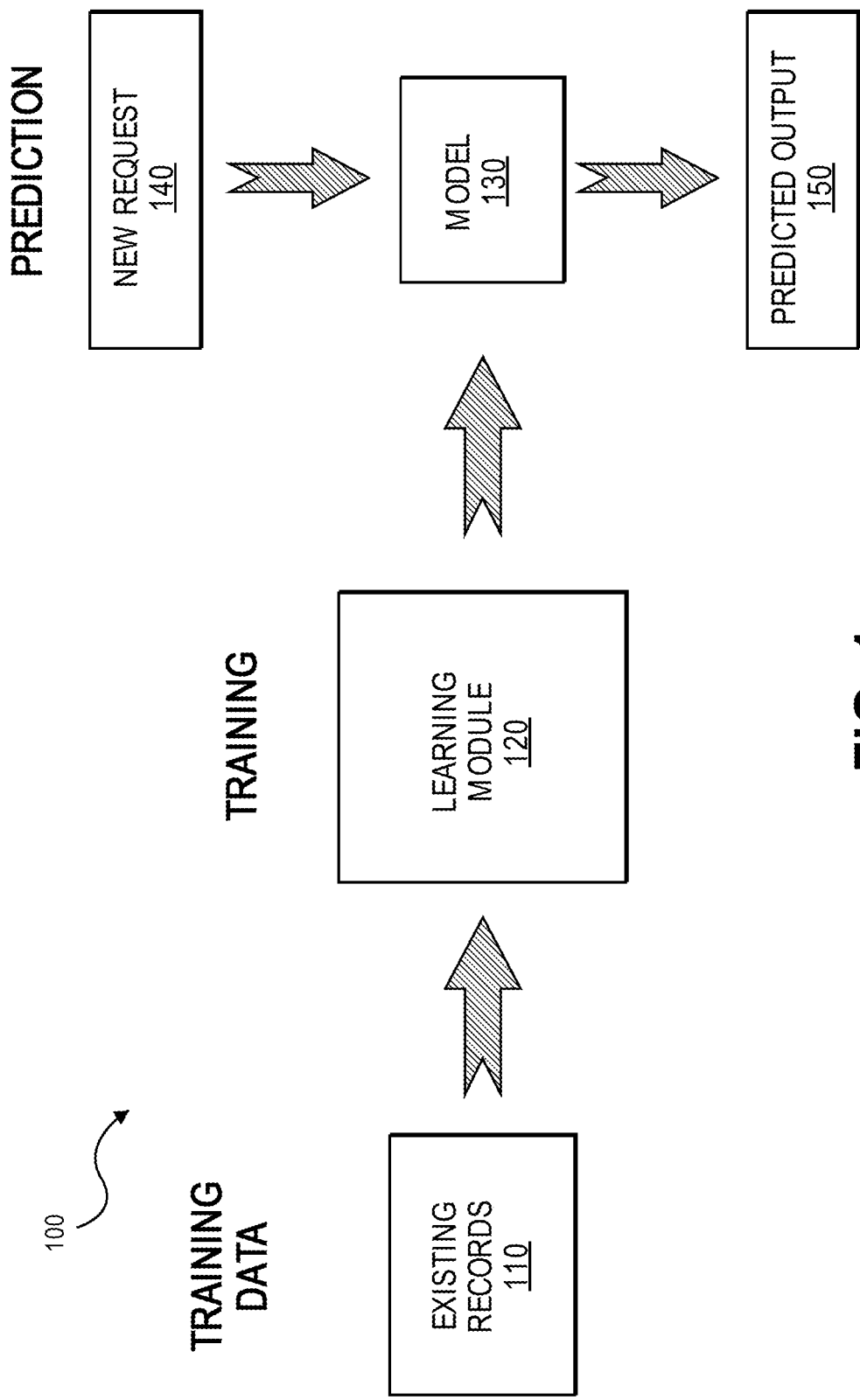
FIG. 1 shows a high-level diagram depicting a machine learning process.

The term "artificial intelligence model" or "AI model" may refer to a model that may be used to predict outcomes in order achieve a pre-defined goal. The AI model may be developed using a learning algorithm, in which training data is classified based on known or inferred patterns. An AI model may also be referred to as a "machine learning model" or "predictive model."

A "graphics processing unit" or "GPU" may refer to an electronic circuit designed for the creation of images intended for output to a display device. The display device may be a screen, and the GPU may accelerate the creation of images in a frame buffer by rapidly manipulating and altering memory. GPUs may have a parallel structure that make them more efficient than general-purpose CPUs for algorithms where the processing of large blocks of data is done in parallel. Examples of GPUs may include RADEON® HD 6000 Series, POLARIS® 11, NVIDIA GEOFORCE® 900 Series, NVIDIA® PASCAL®, etc.

A "topological graph" may refer to a representation of a graph in a plane of distinct vertices connected by edges. The distinct vertices in a topological graph may be referred to as "nodes." Each node may represent specific information for an event or may represent specific information for a profile of an entity or object. The nodes may be related to one another by a set of edges, E. An "edge" may be described as an unordered pair composed of two nodes as a subset of the graph G=(V, E), where is G is a graph comprising a set V of vertices (nodes) connected by a set of edges E. For example, a topological graph may represent a transaction network in which a node representing a transaction may be connected by edges to one or more nodes that are related to the transaction, such as nodes representing information of a device, a user, a transaction type, etc. An edge may be associated with a numerical value, referred to as a "weight", that may be assigned to the pairwise connection between the two nodes. The edge weight may be identified as a strength of connectivity between two nodes and/or may be related to a cost or distance, as it often represents a quantity that is required to move from one node to the next.

"Simulated annealing" may refer to a probabilistic technique for approximating the global optimum of a given function by modeling a system after the physical process of annealing (the metallurgical process of heating a material and then slowly lowering its temperature). In simulated annealing, each configuration of a solution in a search space may represent a different internal energy of the system. A relaxation of the acceptance criteria of the samples taken from the search space can be analogous to heating, while narrowing of the acceptance criteria of samples can be analogous to cooling. Once the system has been sufficiently "cooled", the configuration may represent a sample at or close to a global optimum.

"Graph sharding" may refer to partitioning a graph of data by separating a large graph into smaller and faster/easier to manage parts. A graph may sharded based on the relation of data points to one another, such as through the use of unsupervised learning. For example, a k-means clustering or k-core algorithm can be used to divide a graph into a plurality of overlapping trees, each comprising a subset of nodes and edges from the graph. The trees may be formed such that each tree comprises nodes that are highly connected to one another.

A "subgraph" or "sub-graph" may refer to a graph formed from a subset of elements of a larger graph. The elements may include vertices and connecting edges, and the subset may be a set of nodes and edges selected amongst the entire set of nodes and edges for the larger graph. For example, a plurality of subgraph can be formed by randomly sampling graph data, wherein each of the random samples can be a subgraph. Each subgraph can overlap another subgraph formed from the same larger graph.

A "community" may refer to a group of nodes in a graph that are densely connected within the group. A community may be a subgraph or a portion/derivative thereof and a subgraph may or may not be a community and/or comprise one or more communities. A community may be identified from a graph using a graph learning algorithm, such as a graph learning algorithm for mapping protein complexes. Communities identified using historical data can be used to classify new data for making predictions. For example, identifying communities can be used as part of a machine learning process, in which predictions about information elements can be made based on their relation to one another.

A "data set" may refer to a collection of related sets of information composed of separate elements that can be manipulated as a unit by a computer. A data set may comprise known data, which may be seen as past data or "historical data." Data that is yet to be collected, may be referred to as future data or "unknown data." When future data is received at a later point it time and recorded, it can be referred to as "new known data" or "recently known" data, and can be combined with initial known data to form a larger history.

"Unsupervised learning" may refer to a type of machine learning algorithm used to classify information in a dataset by labeling inputs and/or groups of inputs. One method of unsupervised learning can be cluster analysis, which can be used to find hidden patterns or grouping in data. The clusters may be modeled using a measure of similarity, which can defined using one or metrics, such as Euclidean distance.

An "overlap score" may refer to a quantity measuring the similarity between two sets that are being compared. Each set may be a set of elements, such as a group of nodes and edges of a graph. For example, the sets may be communities of a topological graph, which can be compared by determining the overlap between the two communities (i.e. the nodes and edges that are shared between the two).

A "sample group" may refer to a subset of a population. The population can be a dataset, plurality of datasets, or representations thereof. For example, a probabilistic distribution can be used to generate random samples from a graph. Each sample group can be a subgraph, in which each sample group comprises a subset of an initial graph that is sampled.

DETAILED DESCRIPTION

Embodiments of the invention are directed to a method for accelerating machine learning using graphics processing units (GPUs). In prior methods, graph model building and scoring can be slow and resource intensive. Embodiments of the invention described herein describe a method in which model build and score time can be reduced. A plurality of GPUs can be used to accelerate model building, scoring, and tree traversal.

According to some embodiments, data for a graph can be split using a random re-sampler. Each sample may be distributed across the plurality of GPUs, which may each employ a graph learning algorithm on its local sample to begin the model building process. The output results from graph learning may be, for example, a series of communities generated by each GPU. Furthermore, results from the plurality of GPUs may be merged using a simulated annealing processing in which a normalized overlap score may be used as a merge criteria. The merged model results may include a series of graph databases comprising sub-graphs for the model. Sub-graphs may be sharded to generate a series of trees, and the trees may be distributed across the GPUs to score the model results.

FIG. 1 shows a high-level diagram depicting a machine learning process. According to process 100, a model 130 can be trained using training data, such that the model may be used to make accurate predictions. The prediction can be, for example, a classification of an image (e.g. identifying images of cats on the internet) or as another example, a recommendation (e.g. a movie that a user may like or a restaurant that a consumer might enjoy).

Training data may be collected as existing records 110. Existing records 110 can be any data from which patterns can be determined from. These patterns may then be applied to new data at a later point in time to make a prediction. Existing records 110 may be, for example, user data collected over a network, such as user browser history or user spending history. Using existing records 110 as training data, training may be performed through learning module 120.

Learning module 120 may comprise a learning algorithm, which may be used to build model 130.

Model 130 may be a statistical model, which can be used to predict unknown information from known information. For example, learning module 120 may be a set of instructions for generating a regression line from training data (supervised learning) or a set of instructions for grouping data into clusters of different classifications of data based on similarity, connectivity, and/or distance between data points (unsupervised learning). The regression line or data clusters can then be used as a model for predicting unknown information from known information. Once model 130 has been built from learning module 120, model 130 may be used to generate a predicted output 150 from a new request 140. New request 140 may be a request for a prediction associated with presented data. For example, new request 140 may be a request for classifying an image or for a recommendation for a user.

New request 140 may comprise the data that a prediction is requested for. For example, new request 140 may comprise pixel data for an image that is to be classified or may comprise user information (e.g. name, location, user history, etc.) that can be used to determine an appropriate recommendation. In order to generate predicted output 150 from new request 140, the data included in new request 140 can be compared against model 130. For example, the position of data received in new request 140 on a graph can be compared against a regression line to predict its next state (i.e. according to a trend). In another example, the position of the data as plotted on a topological graph can be used to determine its classification (e.g. predicting tastes and preferences of a user based on his or her online interactions).

According to embodiments of the invention, the machine learning process shown in FIG. 1 can be accelerated using a plurality of graphics processing units (GPUs). This may be achieved by executing model build, result merging, and model scoring on the GPUs as described herein.

Figure 2:
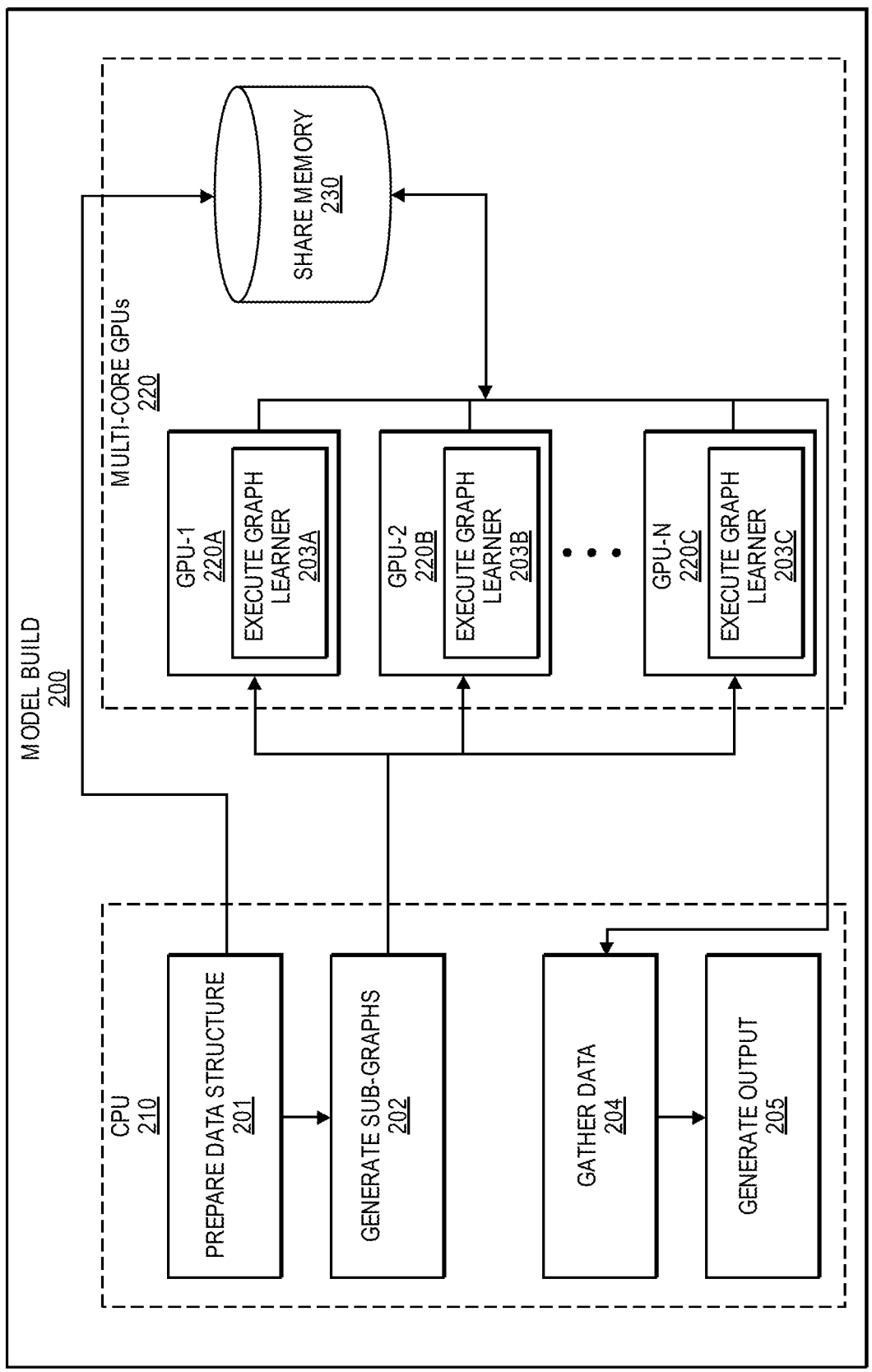
FIG. 2 shows a block diagram of building a machine learning model using a plurality of GPUs according to an embodiment.

FIG. 2 shows a block diagram of building a machine learning model using a plurality of GPUs according to an embodiment. Model build 200 may be performed on a processing device that comprises a central processing unit (CPU) 210 and a plurality of multi-core graphics processing units 220, such as GPU-1 220a, GPU-2 220b, and GPU-N 220c. According to embodiments, the number of GPUs used to carry out the invention may vary (e.g. 1 thru N GPUs). Examples of suitable processing devices may include multi-processor server computers that may comprise server graphics chips, such as NVIDIA® TESLA® and AMD FIRE-PRO®. The processing device may also comprise share memory 230, which may comprise data that is to be read by the multi-core GPUs 220 during the model build.

The model build process may begin at the CPU 210. At step 201, the CPU may prepare the data structure for the building process. This may include generating an initial graph from a plurality of initial known data sets. The plurality of initial known data sets may be, for example, data for users or user devices in a network (e.g. user transaction data and/or device location data). The initial graph may be, for example, a topological graph in which users/devices are represented as nodes and their interactions in the network with one another are represented as edges.

Figure 8:
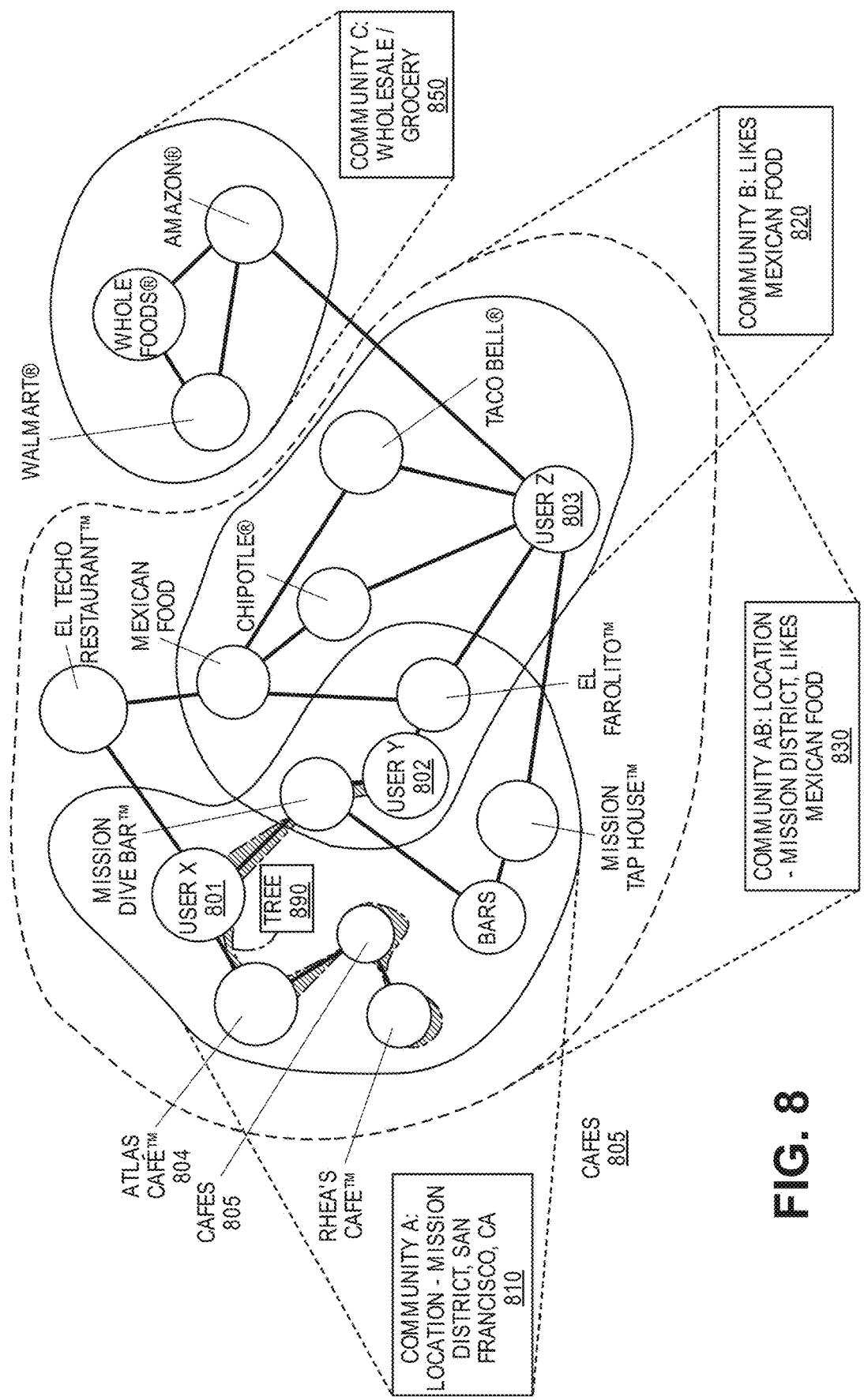
FIG. 8 shows an example of a graph generated from a plurality of data sets.

For reference, FIG. 8 shows an example of a graph generated from a plurality of data sets. FIG. 8 shows a graph of data received in a transaction network. The transaction network may comprise nodes for users, such as User X 801, User Y 802, and User Z 803. The nodes for users may be connected by edges to nodes for transaction data, such as data for merchant names, merchant categories, etc. The edges may represent the relation between nodes, which can be based on transactions comprising information relating to the nodes in the physical world (e.g. financial transactions) and/or based on labels assigned from known information about the real world (e.g. a merchant category code, a merchant location, a user's address, etc.).

According to embodiments, a relation represented by an edge, may further be quantified by an assigned weight and/or by a calculated length/distance, thereby assessing a level of correlation between two nodes. Nodes of a graph can further be classified together into communities, which are each defined by distinct characteristics for which nodes within each community may share some commonality with. For example, a plurality of nodes that are close to one another in distance and that form a dense cluster can be classified as 'Community A: Location—Mission District, San Francisco, CA' 810. Meanwhile, other dense groups of nodes can be classified into other communities, such as 'Community B: Likes Mexican Food' 820 and 'Community C: Wholesale/Grocery' 850. In embodiments, communities can be identified for a graph using a learning algorithm.

Returning to FIG. 2, instructions for performing a learning algorithm using data from the initial graph may be stored in share memory 230 by CPU 210. The learning algorithm may be, for example, a graph learning algorithm that classifies graph data into communities of dense linkage. In addition to instructions for performing learning, additional properties may be stored in share memory 230. This may include node properties that may be used to bias/adjust learning results. For example, for a graph representing a transaction network, an edge representing transactions between a user and Walmart may have less significance for classification than an edge representing transactions between a user and a small local restaurant. The weights of these edges may be adjusted and accounted for through node properties stored in share memory 230 in order to achieve a better model. For example, a node property may comprise logic stating that for edges connected to 'node X,' reduce the weight by 20%.

After the initial graph has been generated from the plurality of initial known data sets, CPU 210 may generate a plurality of sub-graphs at step 202. The subgraphs may be generated in any suitable manner. For example, sub-graphs may be randomly, pseudo-randomly, or systematically selected from the initial graph. The sub-graphs preferably overlap with at least one over sub-graph. In some cases, random samples of overlapping subgraphs may be determined from the initial graph.

In some embodiments, any number of sub-graphs may be generated to suit a particular problem. For example, 1000 sub-graphs may be generated from an initial graph comprising transaction data for San Francisco, while 10,000 sub-graphs may be generated from an initial graph comprising transaction data collected for the entire state of California. In one embodiment, the sub-graphs may have overlapping elements and each sub-graph can contain some of the same information as another sub-graph that is generated. In one embodiment, the sub-graphs may be generated systematically (e.g. dividing the initial graph into evenly divided pieces). In another embodiment, the generated sub-graphs may be generated using random sampling (e.g. according to a Poisson distribution). For example, to generate the sub-graphs, a Poisson distribution curve of discrete probability values may be generated for each edge in the initial graph. Each distribution for a given edge may be based on its weight, such that higher weighted edges may be associated with higher expected number of occurrences. Each distribution can further be down-sampled, such that very low weighted edges and/or very high weighted edges can be included in less samples than as given by its initial Poisson distribution.

For example, the equation:

$$f(k, \lambda) = Pr(X = k) = \frac{\lambda^k e^{-\lambda}}{k!}$$

may be used to generate a probability curve for each edge. k may be an interval (i.e. a possible number samples, e.g. 0 to 10 for a sample size of 10). A, may be the expected number of occurrences in the interval (i.e. rate of occurrence), which may be set as proportional to the edge's weight. For example, a weight of 9 may be assigned an expected occurrence of 9 given an interval of 10 samples, while an edge with a weight of 1 may be assigned an expected occurrence of 1 out of 10 samples i.e. 1 out of 10 sub-graphs. Pr may then represent the probability of an edge being included in any given sample (i.e. any given sub-graph), as dependent on, k and A. Then, to include the edge into a given sample that is being generated, a discrete random number 'X' may be drawn from a uniform distribution and applied to the edge's probability curve. For example, a random number between 0 and 10 may first be drawn/generated. The random number 'X' can then be used as a value of k, such that a probability for the edge to be included in the sample can be calculated (e.g. for an edge with a weight of 9, the number 5 may be randomly drawn and applied as a value of 'k', to yield a probability of $$\left. \frac{9^5 e^{-9}}{5!} = .06. \right)$$

If the probability is greater than a predetermined threshold, then the edge may be included into the given sub-graph (e.g. the predetermined threshold may be 0.05, and the edge may then be included).

For each sample (each sub-graph) that is to be generated, a random number may be generated for each edge in order to determine its inclusion into the sample. For example, to generate the samples using each edge's Poisson distribution, 10 empty arrays may first be allocated for 10 desired sub-graphs to be generated. When building a given array (i.e. when generating one of the sub-graphs), a random number X may be generated for each edge and applied to the equation:

$$Pr(X = k) = \frac{\lambda^k e^{-\lambda}}{k!},$$

where k is equal to X and A is the down-sampled weight of the edge (reduced weight). The probability determined from this equation can then be compared to a predetermined cut-off threshold. If the probability is greater than the predetermined cut-off threshold, then an identifier for the edge can be placed as an element of the array (i.e. the edge is thus included in the sub-graph). This process may be continually performed for each edge to build the given sub-graph. To build all 10 sub-graphs, the process may then be performed 9 additional times. For example, an embedded 'for' loop may be used, wherein a first 'for' loop generates a random number for each edge T, to determine its inclusion into a sub-graph T, and wherein a second 'for' loop can be used to repeat the first 'for' loop for each of the 10 arrays and build each sub-graph. Thus, 10 sub-graphs may be generated, wherein each sub-graph comprises a different subset of edges from the initial graph (as randomly selected based on each edge's weighted probability of occurrence). Thus, in these embodiments, subgraphs may be generated by removing different combinations of edges from initial graphs.

Once the sub-graphs have been generated, the sub-graphs may be distributed (e.g. randomly) across the plurality of multi-core GPUs 220. At steps 203*a*, steps 203*b*, and 203*c*, learning may be performed on the plurality of subgraphs by GPU-1 220*a*, GPU-2 220*b*, and GPU-N 220*c* respectively, in conjunction with the data stored in share memory 230. In one embodiment, the learning algorithm may be an unsupervised learning algorithm that may be used to group data into distinct communities of distinct information, as represented by a plurality of nodes and edges. In an embodiment, the unsupervised learning algorithm may be a graph learning algorithm that can group nodes into dense clusters based on distance. For example, the learning instructions can be the following:

1) Create a sorted list of edges using an edges' connectivity and overall count as a weight.
2) For each edge, generate a descending sorted collection of neighboring edges using the above defined weight as the sort by.
3) For each neighboring edge, generate the distance between the neighbor and the target edge.
4) If a distance is greater than a cut off value, then add the neighboring edge to a community.
5) Repeat until all edges are associated with a community.

Examples of suitable learning algorithms for identifying communities may include: Fastgreedy, Spinglass, Walktrap, Edge Betweenness, Infomap, Label Propagation, Optimal Modularity, and Multilevel. Furthermore, the graph learning algorithm can be an algorithm that identifies communities that overlap one another (i.e. shared nodes). For example, a graph learning algorithm typically used for identifying protein complexes based on overlapping clusters can also be used to classify nodes in any interaction network (e.g. grouping nodes of a transaction network). The graph learning algorithm may comprise computing a weight of each node in the topological graph based on the computed weights of each of the edges, and generating a queue comprising the nodes in decreasing order by weight. A seed node may be selected from the top of the queue to generate a community. Calculated interaction probabilities between nodes can then be used to add nodes to the community in an iterative manner. The added nodes can then be removed from the queue, and the node left at the top of the queue can be used as a seed for the next community. This process can then be repeated, until the queue has been emptied, to generate a plurality of communities.

More information can be found at:

Li M, Chen J, Wang J, Hu B, Chen G. Modifying the DPClus algorithm for identifying protein complexes based on new topological structures. BMC Bioinformatics, 2008, 9: 398

Once each of the plurality of multi-core GPUs 220 have executed the learning algorithm on each of their local subgraphs to identify communities within the subgraphs, the identified communities may be gathered at the CPU in step 204. In one embodiment, this may include aggregating the communities outputted from each of the learners executed on each of the GPUs.

At step 205, the output from the model build process may be generated. In one embodiment, this may include an aggregated list of communities found from graph learning, and the nodes and edges that make up each community. In one embodiment, each community may be identified by a community ID. The communities may further be identified by a learner ID, identifying the learner or GPU on which the community was generated (e.g. ID:1=GPU-1 220a, ID: 2=GPU-2 220b, etc.). Furthermore, the nodes included in each community may be identified as a list of unique node identifiers (node IDs) linked to the community ID. For example, community 'A' may be linked to node '123512,' node '125923', node '402415,' etc., which may represent data included in community 'A' (e.g. users, merchants, content, etc. that are classified as sharing characteristics and belonging to community 'A'). In embodiments, communities may overlap and any given node can belong to more than one community.

Figure 3:
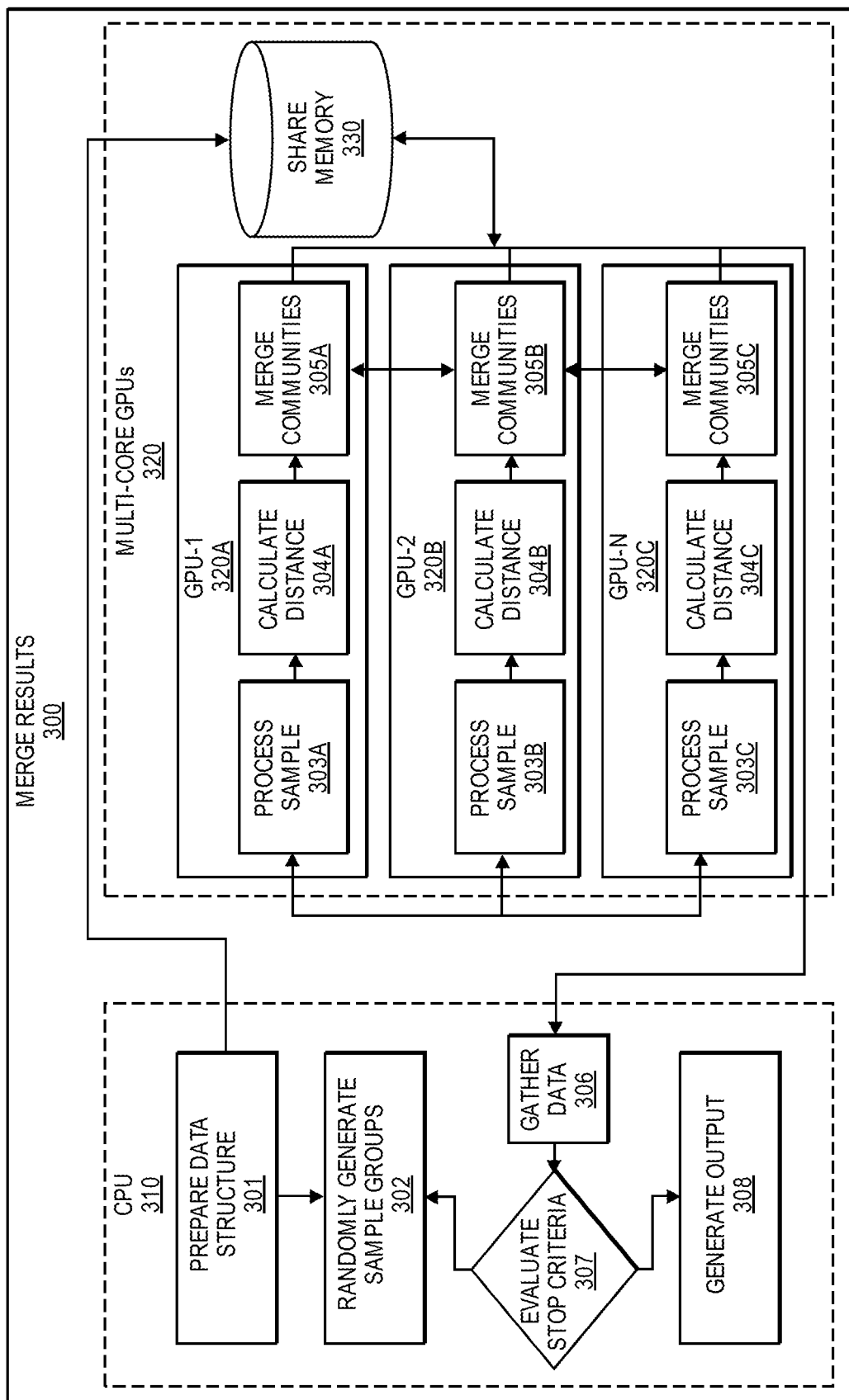
FIG. 3 shows a block diagram of merging results from a plurality of GPUs according to an embodiment

FIG. 3 shows a block diagram of merging results from a plurality of GPUs according to an embodiment. According to embodiments, once communities have been generated by the plurality of multi-core GPUs 220 through learning, the results may further be merged to compress the file size of the model, thus keeping only distinct and necessary information, and thus allowing training of the model to be performed more quickly. In embodiments, the resulting communities from the model build process shown in FIG. 2 may be merged together on the plurality of multi-core GPUs based on similarity.

Similar to the model build process shown in FIG. 2, merge results process 300 may be performed using a CPU 310, a plurality of multi-core GPUs 320, and a share memory 330. At step 301, the data structure may be prepared. At this step, the list of communities identified in the model build phase may be formatted for processing by multi-core GPUs 320. In addition, node properties and merge instructions may be loaded into share memory 330 by CPU 310.

At step 302, the list of identified communities may be divided, by CPU 310 into random sample groups for distribution to the plurality of multi-core GPUs 320. For example, a Poisson distribution may be used to generate overlapping sample groups from the community list, which may each be loaded into GPU-1 320a, GPU-2 320b, GPU-N 330c, etc. for merging similar communities. This may be done such that the each GPU of multi-core GPUs 320 may process and merge a different sample group of community groups from one another. At step 303a, 303b, and 303c the sample groups distributed from CPU 310 may be received at GPU-1 320a, 320b, 320c respectively, and the merge instructions and node properties may be read from share memory 330.

At step 304a, 304b, and 304c, GPU-1 320a, GPU-2, and GPU-N respectively may each calculate a distance between community groups in its received sample group. In one embodiment, the distance calculated between community groups may be a normalized overlap score reflecting the similarity between two community groups in the sample group. For example, the normalized overlap score may be calculated as:

$$\text{Overlap Score} = \frac{A \cap B}{\text{Min}(A, B)}$$

where A is a first community group in a sample group and B is a second community group in a sample group. A n B may be the elements shared between A and B. Min(A, B) may be the minimum amount of elements in a community between A and B. According to embodiments, a distance (e.g. overlap score) may be calculated for each pair of communities in a sample group received at a given GPU in the plurality of multi-core GPUs 320 (GPU-1 320a, GPU-2 320b, GPU-N 320c, etc.).

At step 305a, 305b, and 305c, GPU-1 320a, GPU-2 320b, and GPU-N may merge communities in its received sample group based on the calculated distances between the communities (e.g. based on the overlap score). For example, if an overlap score calculated between two communities is above a cutoff threshold, the communities may be merged and may be represented as a single community with a new community ID. In one embodiment, the new community ID may be derived from the community IDs of the merged communities. For example, the new community ID may be derived by concatenating the community IDs of two communities that were merged (e.g. community 'A'+community 'B'=community 'AB'). In an embodiment, the two communities that are merged may be overlapping communities comprising one or more of the same nodes, and the single new community may comprise all of the elements of both merged communities (i.e. all of the overlapping nodes and edges between the two communities as well as all non-overlapping nodes and edges). For example, referring to FIG. 8, 'Community A: Location—Mission District, San Francisco, CA' 810 may be merged with 'Community B: Likes Mexican Food' 820 to form 'Community AB: Location—Mission District, Likes Mexican food' 830. Community AB 830 may then comprise the nodes and edges of both Community A 810 and Community B 820, such as nodes for User X 801, User Y 802, User Z 803 and direct connections thereof. In an embodiment, once new communities have been created from merged communities, the original communities that are merged may be removed or erased from memory.

Returning back to FIG. 3, at step 306, the output from the multi-core GPUs 320 comprising the merged communities may be gathered at the CPU. For example, an updated list of communities may be aggregated after a merge process has been performed at each of the GPUs in multi-core GPUs 320. At step 307, the CPU may evaluate the stop criteria for the merge result process. If the stop criteria has been met, CPU 310 may perform step 302 to generate new sample groups from the updated community list, prior to re-distribution to the multi-core GPUs 320 for distance calculation and merging. In one embodiment, the stop criteria may be an optimal file size that a set of merged communities may converge to. For example, the merge process may be iteratively repeated until the updated community list is compressed to an optimal file size (e.g. 1 GB to 2 GB), while maintaining distinct and accurate information for the plurality of initial known data sets.

Once the stop criteria has been satisfied, a resulting set of communities may be outputted by CPU 310. The resulting set of communities or derivatives thereof may then be used classify an unknown data set. The unknown data set may comprise data received in a request for a prediction. For example, the unknown data set may comprise one or more requests for a recommendation (e.g. for a movie, restaurant, etc.) that meets a user's tastes and preferences. A prediction may then be generated by comparing the unknown data set to the set of communities resulting from after the merge process, in order to classify the data (e.g. user 'X' lives in San Francisco and belongs to community 'Y': recommend restaurant 'Z'). After an unknown data set has been applied to the set of communities or derivatives thereof to classify the unknown data set, the model may be scored by comparing the communities with an updated graph comprising new data. In this manner, the model may be trained such that higher scoring communities may be used for recommendations over lower scoring communities.

Figure 4:
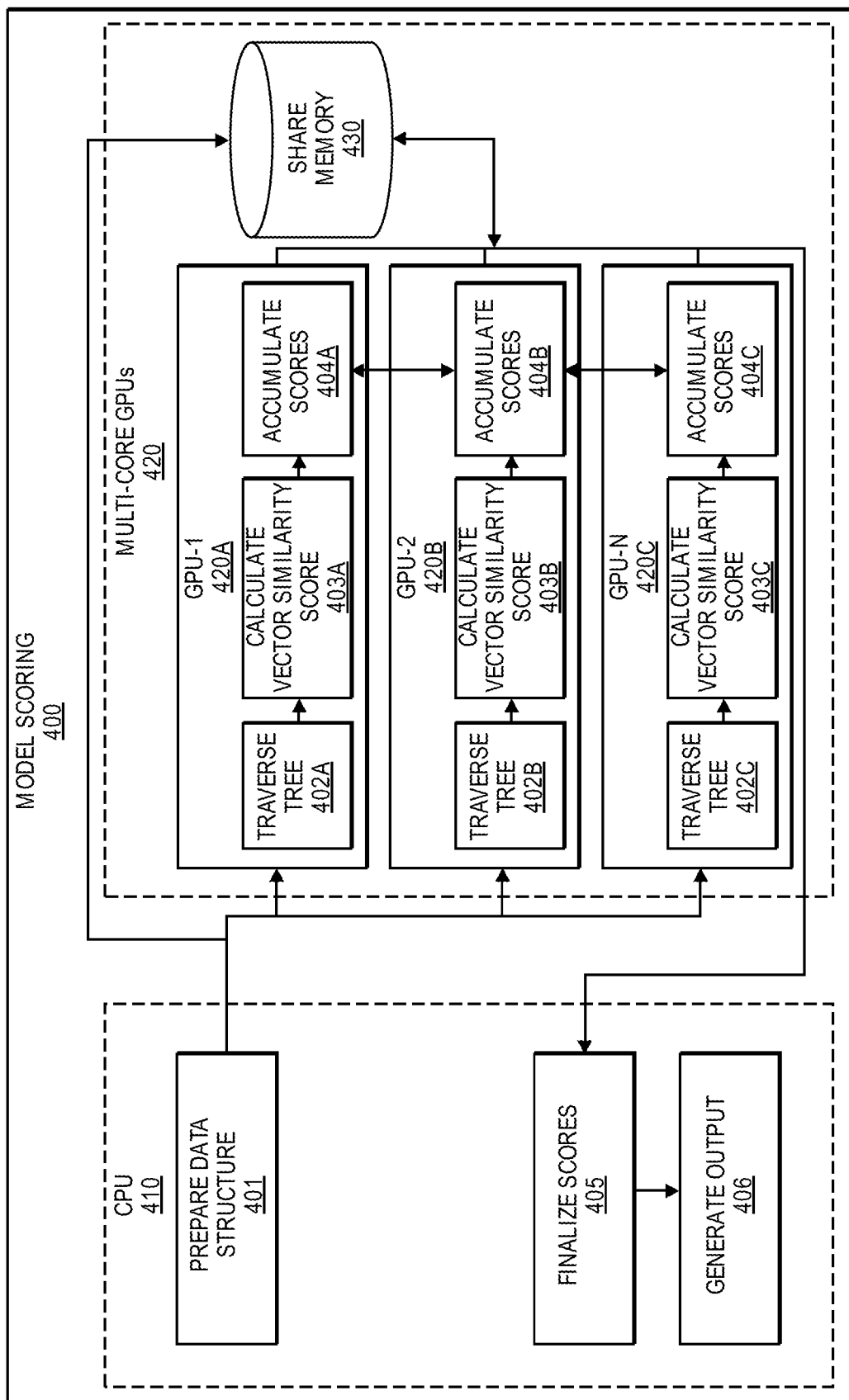
FIG. 4 shows a block diagram of scoring a model across GPUs according to an embodiment.

FIG. 4 shows a block diagram of scoring a model across GPUs according to an embodiment. According to embodiments, during a request for a prediction, unknown data may be applied to a machine learning model comprising communities for classifying the unknown data. To train the model, scoring may be performed, wherein the produced set of communities are scored against an updated graph comprising the plurality of initial known data sets and a plurality of new known data sets. For example, for a machine learning model for generating user recommendations, a model generated using initial user data (e.g. user transaction history) may be used to generate requested recommendations, and the model may then be scored by comparing the model to new user data received at a later point in time (e.g. the user's updated transaction history comprising transactions conducted after the requested recommendations have been generated).

As in the model build 200 and merge results process 300 of FIG. 2 and FIG. 3 respectively, model scoring process 400 may be implemented using a CPU 410, multi-core GPUs 420, and a share memory 430. The multi-core GPUs 420 may comprise a plurality of GPUs, such as GPU-1 420a, GPU-2 420b, GPU-N 420c, etc.

At step 401, the CPU may prepare the data structure for scoring. The set of communities may be formatted by the CPU for loading, distribution, and scoring for the multi-core GPUs 420. In addition, scoring instructions and node properties may be obtained and loaded into share memory 430. In one embodiment, preparing the data structure may additionally comprise performing graph sharding, which can be used to allow a tree traversal process to run faster.

Figure 5:
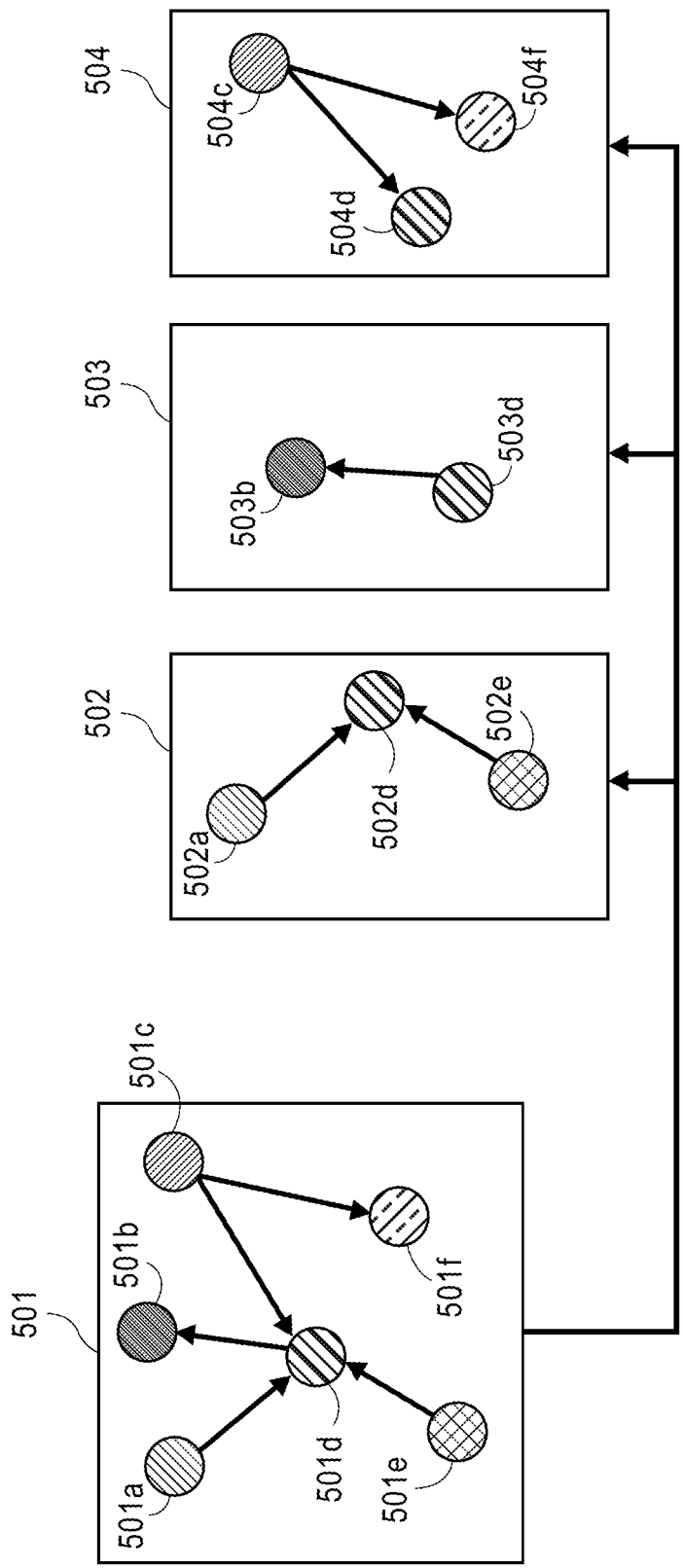
FIG. 5 shows a depiction of graph sharding according to an embodiment.

For reference, FIG. 5 shows a depiction of graph sharding according to an embodiment. A sub-graph 501 from the machine learning model (comprising merged communities) may be sharded across GPUs. The sub-graph 501 may comprise nodes 501a, 501b, 501c, 501d, 501e, and 501f. Graph sharding may involve dividing portions of a subgraph to produce derivatives of merged communities, which comprise fewer nodes and thus smaller trees for tree traversal.

In one embodiment, the sharding may be based on a per-calculate overlap between community groups in a sub-graph, such as through K-means clustering. In another embodiment, graph sharding may be performed based on a strength of connectives between nodes that reduces sets of weak edges, such as sharding using a K-core algorithm. The selected K-core algorithm may further be an iterative down-sample K-core process to yield better results. For example, by down sampling the weight of edges at each iteration of the K-core algorithm, all of the nodes of a sub-graph may be formed into at least one tree based on the linkages between the nodes. Upon performing of the graph sharding process, the sub-graph may be divided into a plurality of overlapping trees derived from the sub-graph. For example, a first tree 502 may comprise of nodes 502a, 502d, and 502e which may correspond to nodes 501a, 501d, and 501e of sub-graph 501 respectively. A second tree 503 may comprise of nodes 503b and 503d, which may correspond to nodes 501b and 501d of sub-graph 501 respectively. A third tree 504 may comprise nodes 504c, 504d, and 504f.

Returning to FIG. 4, once the data structure has been prepared, the sharded sub-graphs may be distributed to the multi-core GPUs 420 for tree traversal. At step 402a, 402b, and 402c tree traversal may be performed by GPU-1 420a, GPU-2 420b, and GPU-N 420c respectively. According to embodiments, when unknown data is received in a request for a prediction, the unknown data may be applied to the model (i.e. the communities) at one of the GPUs in the plurality of multi-core GPUs 420 (e.g. GPU-1 420a, GPU-2 420b, etc.).

During classification of the unknown data using the model, the data may be compared against communities based on the distance and connectivity of the unknown data to nearby nodes. For example, for a request for a user recommendation, the user's data (e.g. user history, user location, etc.) may be plotted on a graph representing interactions in a transaction network. Tree traversal may then be used to apply the user data's to the community list, by traversing a tree of nodes linked to the user's data (i.e. a user input node) until a suitable prediction has been determined (i.e. a suitable output node included in a potential user community). For example, with reference to FIG. 8, User 'Y' 802 may request a recommendation for a café located in the Mission District of San Francisco, CA User 'Y' 802 may belong to Community 'A,' 810 and a tree of Community 'A' 890 may be traversed to find a suitable recommendation. The traversal may begin from the node for User 'Y' 802, and may continue along tree 890 until an output node linked to 'Cafes' 805 is arrived at, such as a node for 'Atlas Café' 804. Node 804 may then be outputted as prediction to the requested recommendation (e.g. an identifier for the node may be determined, and a message comprising the identifier may be sent from a server computer to the user device requesting the recommendation).

Over time, a plurality of requests for predictions may be received, and a plurality of predictions may be generated for each request. Each request may be forwarded to a given GPU in the plurality of multi-core GPUs, and a prediction may be generated for each request by traversing a tree at the given GPU (i.e. at one of GPU-1 420a, GPU-2 420b, GPU-N, etc.) After a plurality of predictions have been determined, the predictions/classifications can later be compared against a new set of known data to score the accuracy of the model.

At step 403a, 403b, and 403c of FIG. 4, vector similarity scores may be calculated between the communities and an updated graph comprising initial known data sets and new known data sets at GPU-1 420a, GPU-2 420b, and GPU-N 420c respectively in order to score the model. In one embodiment, the vector similarity score may be calculated as:

$$\text{Score } 1 = \frac{A \cap B}{\text{Min}(A, B)}$$

$$\text{Score } 2 = \frac{A \cap B}{\text{Max}(A, B)}$$

$$Score_{vector\_similarity} = \alpha * \text{Score } 1 + (1 - \alpha) * \text{Score } 2$$

where A is an updated sub-graph comprising new known data sets, B is a community of the generated model, Min(A, B) is the minimum number of elements between A and B (e.g. if A has 5 elements, and B has 10 elements, the minimum would be 5), Max(A,B) is the maximum number of elements between A and B (e.g. 10 elements), and α is an adjustable parameter.

In one embodiment, vector similarity scores for each updated sub-graph comprising the new known data sets may be compared against each community. For example, in a network comprising a plurality of users conducting a plurality of interactions (e.g. transactions, content views, etc.), sub-graphs may be generated for each user's history (e.g. spending history, viewing history, etc.), which may be scored against each community comprising the user's data (e.g. a plurality of communities comprising merchants in the user's geographical area or a plurality of communities comprising content tags associated with the user's preferences). In one example, an updated graph may be generated from historical transactions conducted over a network, and a plurality of sub-graphs may be generated from the updated graph. The sub-graphs may each comprise an updated transaction history for a given user. The communities may then be scored, by the multi-core GPUs 420, by comparing the communities that include a given user node to the nodes of the sub-graph for the given user. This may include nodes for merchants whose connection to the user may have been the result of a recommendation.

At step 404*a*, 404*b*, and 404*c* the scores for the communities may be accumulated over GPU-1 420*a*, GPU-2 420*b*, and GPU-N 420*c*. In one embodiment, a set of scores calculated for a given community may be accumulated by taking an average (e.g. a weighted average) for the calculated scores. For example, community 'B' (representing a group of merchants) may receive a vector similarity score of '10' against sub-graph 'A' (representing transaction data for user 'A'), and community 'B' may receive a vector similarity score of '6' against sub-graph 'C' (representing transaction data for user 'C'). The scores for community 'B' may then be accumulated by taking an average of the calculated scores for the community (e.g. '[10+6]/2=8.') The scores may further be averaged across GPUs. For example, more than one score for a given community may be calculated by GPU-1 420*a*, GPU-2 420*b*, GPU-N 420*c*, etc. and the scores for the community may be accumulated by taking the average of the scores calculated between GPU-1 420*a*, GPU-2 420*b*, and GPU-N 420*c*.

At step 405, the scores determined at the multi-core GPUs 420 may be outputted to, received by, and finalized by CPU 410. In one embodiment, finalizing the scores may comprise calibrating the scores to fit within a predetermined range. In another embodiment, finalizing the scores may comprise applying predetermined rules to the calculated scores. For example, a hard-coded rule may be applied, in which the score for community 'A' is to be multiplied by a factor of '1.32'.

At step 406, CPU 410 may generate an output for the scoring process. The output may be an updated list of communities (identified by unique community IDs, and as associated with a plurality of node IDs for nodes included in each community), where each community is linked to a finalized score for each community. In one embodiment, the top scoring communities may be saved and used for classifying data in future predictions, while the bottom scoring communities may be erased or may be used less frequently in predictions. For example, for a machine learning model trained to give user recommendations, only the top 3 scoring communities associated with the user's data (e.g. top 3 scoring communities containing restaurants nearby) may be used to generate recommendations for the user.

Embodiments of the invention provide a number of technical advantages over prior art. Embodiments allow for the acceleration of model building and model scoring through parallel processing performed on graphics processing units (GPUs). Furthermore, embodiments provide a method for merging results from graph learning performed on separate processors, and do so in a manner that compresses file size while minimizing loss of important and distinct information needed for accurate predictions. The compression of the model data, and the parallel nature of the model build, merge, and scoring processes allow for faster processing of large data sets, in which model build and training performed on a CPU may otherwise take too long for desired results.

Figure 6:
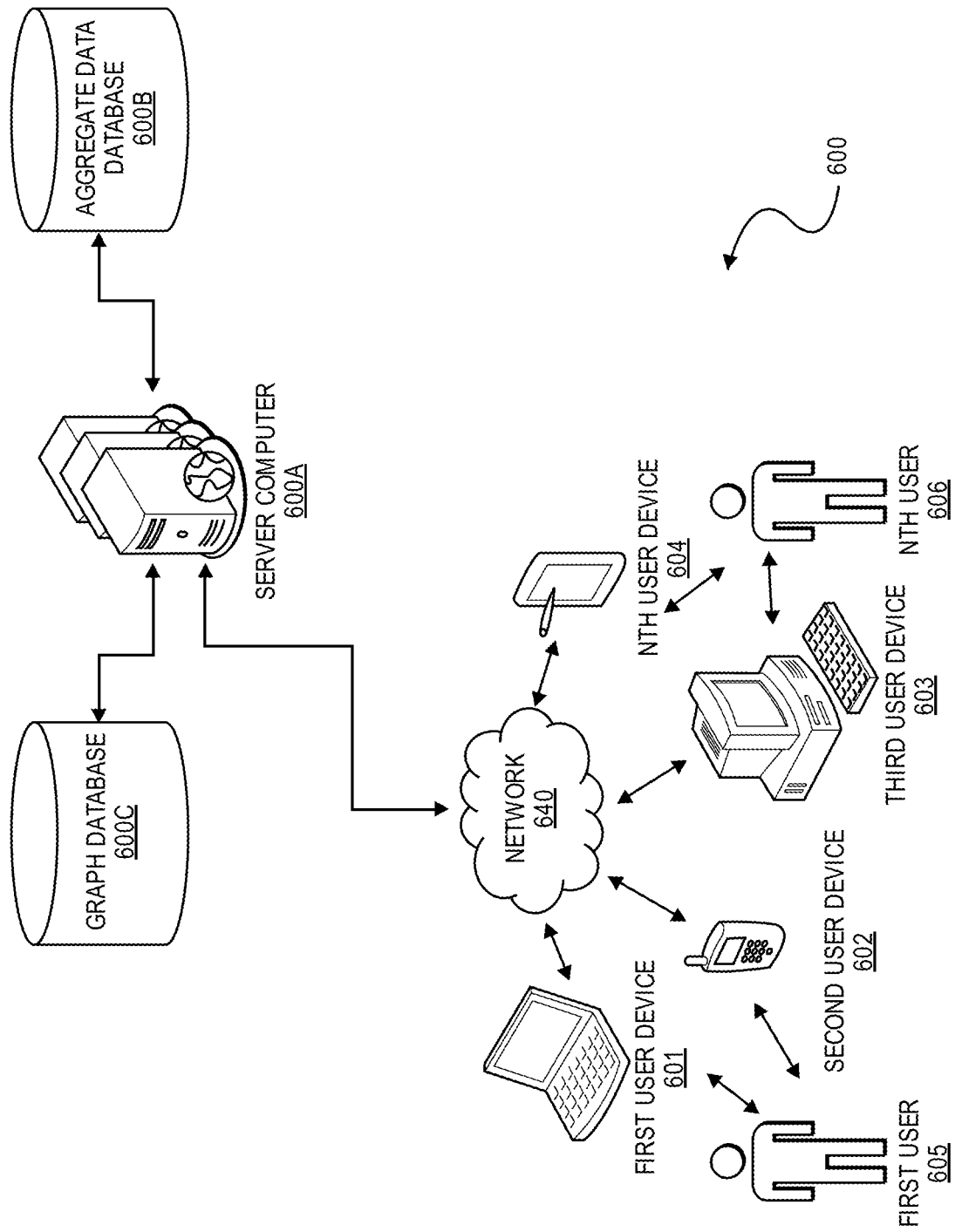
FIG. 6 shows an example of user data collected over a network according to an embodiment.

FIG. 6 shows an example of user data collected over a network according to an embodiment. Data collection 600 may comprise a plurality of users such as first user 605 and nth user 606. The plurality of users may access services provided by server computer 600A or an entity of server computer 600A by establishing a connection over network 640 using one or more devices, such as first user device 601, second user device 602, third user device 603, and nth user device 604.

According to embodiments, server computer 600A may be a server computer of a media content provider, transaction processing service, or any other provider of services for users, such as a transportation/ride-sharing service, food delivery service, social media platform, etc. The plurality of user devices may be any processing device capable of receiving, storing, and sending data over a network, such as a laptop, mobile phone, desktop computer, tablet, wearable device, POS terminal, etc. Network 640 may be any network for transmitting and receiving data to and from the plurality of user devices, such as the internet or a transaction processing network (e.g. VISANET®).

In embodiments, when a user accesses services provided by a service provider, user data is collected, recorded, and stored by server computer 600A. For example, server computer 600A may collect metadata for a video that is uploaded, downloaded, or streamed over network 640 on nth user device 604, which may include a title, a description, content tags, annotations, etc. In another example, when nth user 606 conducts a transaction at a merchant, a transaction ID, a transaction amount, a transaction timestamp, and a merchant category code may be recorded and associated with the user's payment account by server computer 600A. In yet another example, server computer 600A may be a server computer that provides backend support for a mobile application, and server computer 600A may collect and store user location data received from GPS data from a mobile phone, such as from second user device 602.

In one embodiment, user data may be stored by server computer 600A in aggregate data database 600B. For example, aggregate data database 600B may be a centralized database comprising user profiles, user transaction history, user viewing history, etc. According to embodiments, server computer 600A may use data stored in aggregate data database to build and train a machine learning model for generating predictions. For example, server computer 600A may be a server computer of an audio or video streaming service, which may use a user's streaming history to build a model. The model can then be used to classify a user by his or her tastes and preferences, and may use the classification of the user to generate recommendations to stream other content.

In one embodiment, the model generated by server computer 600A may be generated through graph learning performed on a plurality of graphics processing units, such as through model build 200, merge result process 300, and model scoring 400 of FIG. 2, FIG. 3, and FIG. 4 respectively. In an embodiment, graph learning may be used to generate sub-graphs comprising communities, which may be stored in graph database 600C. A user (e.g. first user 605) utilizing a service provided by an entity of server computer 600A, may receive one or more recommendations (i.e. predictions) on his or her device (e.g. second user device 602) based on user data, such as user history and user location data. In an embodiment, the recommendations may be generated by applying the user's data to one or more communities stored in a sub-graph of graph database 600C. For example, first user 605 may request a recommendation for a nearby restaurant, and first user 605's location data (as provided by second user device 602) as well as first user 605's transaction history may be compared by server computer 600A against communities that are associated with a high overlap or high vector similarity score against first user 605's data (location and transaction history). The nodes of the communities or derivatives thereof may then be traversed to find an output node that meets predetermined criteria, which may be of a merchant that is nearby and popular with user's similar to first user 605.

Figure 7:
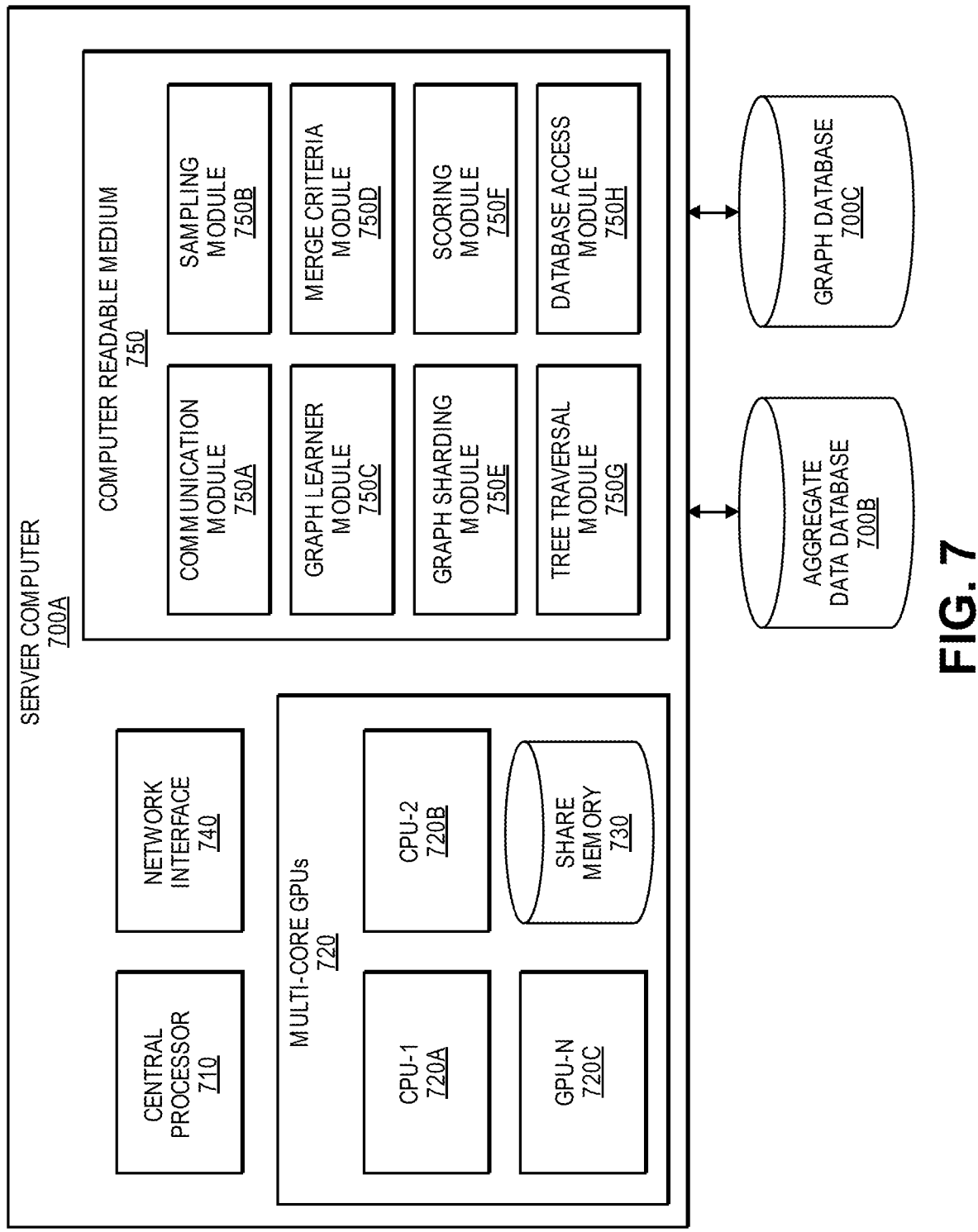
FIG. 7 shows a block diagram of a server computer according to an embodiment.

FIG. 7 shows a block diagram of a server computer according to an embodiment. Server computer 700A may be, for example, server computer 600A of FIG. 6. Server computer 700A may comprise a central processor 710 for processing received data. Central processor 710 may be CPU 210, CPU 310, and/or CPU 410 of FIG. 2, FIG. 3, and FIG. 4 respectively.

Server computer 700A may further comprise multi-core GPUs 720 for parallel processing. Multi-core GPUs 720 may be multi-core GPUs 220, multi-core GPUs 320, and/or multi-core GPUs 420 of FIG. 2, FIG. 3, and FIG. 4. According to embodiments, multi-core GPUS 720 may comprise a plurality of graphics processing units that may process data and perform calculations in parallel, such as GPU-1 720A, GPU-2 720B, and GPU-N 720C. Multi-core GPUs 720 may further comprise share memory 730, which may comprise data readable by the plurality of graphics processing units during the performance of data processing and calculations.

Server computer 700A may further comprise a network interface 740 for receiving data over a network, such as network 640 of FIG. 6. Server computer 700A may also comprise computer readable medium 750 for storing modules of instructions executable by central processor 710 (e.g. code). Computer readable medium 705 may comprise one or more modules, such as communication module 750A, graph generation module 750B, GPU interface module 750C, sampling module 750D, formatting module 750E, GPU instructions module 750F, Output module 750G, graph sharding module 750H, score finalization module 750I, and database access module 750J. Server computer 700A may further be coupled to one or more databases, such as aggregate data database 700B and graph database 700C, which may be aggregate data database 600B and graph database 600C of FIG. 6 respectively. Aggregate data database 700B may comprise data collected over a network, such as user data for building and training a machine learning model. Graph database 700C may comprise a plurality of graphs and/or sub-graphs generated from aggregated data and/or learning.

Communication module 750A may comprise instructions executable by central processor 710 for receiving, transmitting, formatting, and reformatting messages over network interface 740. For example, communication module 750A may comprise code for receiving user data over the internet from a user device (e.g. second user device 602 of FIG. 6) and for sending a recommendation to the user device that may be based on an application of the user's data to a machine learning model.

Graph generation module 750B may comprise instructions executable by central processer 710 for generating a graph from received data. For example, graph generation module 750B may comprise code for generating a topological graph of nodes and edges based on user data received over network interface 740.

GPU interface module 750C may comprise instructions executable by central processer 710 for interfacing with multi-core GPUs 720. For example, GPU interface module 750C may comprise code for initiating a process to be executed by the plurality of GPUs of multi-core GPUs 720 in parallel, and for sending data necessary for carrying out said processes to GPU-1 720A, GPU-2 720B, GPU-3 730c and share memory 730.

Sampling module 750D may comprise instructions executable by central processor 720 for generating samples of data for distribution to multi-core GPUs 720. For example, sampling module 750D may comprise code for generating a plurality of random overlapping sub-graphs from an initial topological graph based on a Poisson's distribution.

Formatting module 750E may comprise instructions executable by central processor 710 for formatting data for one or more processes and/or calculations, including by multi-core GPUs 720. For example, formatting module 750E may comprise code for preparing a data structure prior to model building, result merging, and model scoring, and in such a manner that said processes may be performed in parallel by GPU-1 720A, GPU-2 720B, and GPU-N 720C.

GPU instructions module 750F may comprise instructions executable by central processor 710 for instructing multi-core GPUs to carry out one or more processes. For example, GPU instructions module 750F may comprise code for a graph learning algorithm to be performed by GPU-1 720A, GPU-2 720B, and GPU-N 720C. GPU instructions module 750F may also comprise code for calculating an overlap score for a merge process to be performed by multi-core GPUs and code for calculating a vector similarity score for a model scoring process to be performed by multi-core GPUs. In addition, GPU instructions module 750F may also comprise code for instructing one or more GPUs of multi-core GPUs to apply user data to a model using tree traversal.

Output module 750G may comprise instructions executable by central processor 710 for generating an output from one or more processes. For example, output module 750G may comprise instructions for generating a list of community IDs associated with node identifiers, based on results from graph learning performed by multi-core GPUs 720. Output module 750G may also comprise code for evaluating a stop criteria during a merging process performed by multi-core GPus 720 (e.g. evaluating an optimal file size), and for generating a list of merged communities. In addition, output module 750G may also comprise code for generating a list of scores for each merged community, which may be an assessment of the accuracy of a machine learning model, and which may be used to determine communities to use during a request for a prediction.

Graph sharding module 750H may comprise instructions executable by central processor 710 for sharding a graph. For example, graph sharding module 750H may comprise code for performing an iterative down sample k-core algorithm on a plurality of sub-graphs to generate a plurality of trees. The tree may then be traversed during the application of unknown data sets to a machine learning model.

Score finalization module 750I may comprise instructions executable by central processor 710 for finalizing scores during a scoring process. For example, score finalization module 750I may comprise code for averaging a plurality of community scores generated by a plurality of GPUs.

Database access module 750J may comprise instructions executable by central processor 710 for querying and updating a database, such as aggregate data database 700B and/or graph database 700C. For example, database access module 750J may comprise code for retrieving transaction data from aggregate data database 700B for generating a topological graph. In addition, database access module may comprise code for querying graph database 700C for a plurality of sub-graphs. The plurality of sub-graphs may then be used for a result merging and/or model scoring process.

Any of the computer systems mentioned herein may utilize any suitable number of subsystems. In some embodiments, a computer system includes a single computer apparatus, where the subsystems can be the components of the computer apparatus. In other embodiments, a computer system can include multiple computer apparatuses, each being a subsystem, with internal components. A computer system can include desktop and laptop computers, tablets, mobile phones and other mobile devices.

Subsystems described herein may be interconnected via a system bus. Additional subsystems such as a printer, keyboard, storage device(s), monitor, which is coupled to display adapter, and others are shown. Peripherals and input/output (I/O) devices, which couple to I/O controller, can be connected to the computer system by any number of connections known in the art such as input/output (I/O) port (e.g., USB, FireWire®). For example, I/O port or external interface (e.g. Ethernet, Wi-Fi, etc.) can be used to connect computer system to a wide area network such as the Internet, a mouse input device, or a scanner. The interconnection via system bus allows the central processor to communicate with each subsystem and to control the execution of a plurality of instructions from system memory or the storage device(s) (e.g., a fixed disk, such as a hard drive, or optical disk), as well as the exchange of information between subsystems. The system memory and/or the storage device(s) may embody a computer readable medium. Another subsystem is a data collection device, such as a camera, microphone, accelerometer, and the like. Any of the data mentioned herein can be output from one component to another component and can be output to the user.

A computer system can include a plurality of the same components or subsystems, e.g., connected together by external interface or by an internal interface. In some embodiments, computer systems, subsystem, or apparatuses can communicate over a network. In such instances, one computer can be considered a client and another computer a server, where each can be part of a same computer system. A client and a server can each include multiple systems, subsystems, or components.

Aspects of embodiments can be implemented in the form of control logic using hardware (e.g. an application specific integrated circuit or field programmable gate array) and/or using computer software with a generally programmable processor in a modular or integrated manner. As used herein, a processor includes a single-core processor, multi-core processor on a same integrated chip, or multiple processing units on a single circuit board or networked. Based on the disclosure and teachings provided herein, a person of ordinary skill in the art will know and appreciate other ways and/or methods to implement embodiments of the present invention using hardware and a combination of hardware and software.

Any of the software components or functions described in this application may be implemented as software code to be executed by a processor using any suitable computer language such as, for example, Java, C, C++, C #, Objective-C, Swift, or scripting language such as Perl or Python using, for example, conventional or object-oriented techniques. The software code may be stored as a series of instructions or commands on a computer readable medium for storage and/or transmission. A suitable non-transitory computer readable medium can include random access memory (RAM), a read only memory (ROM), a magnetic medium such as a hard-drive or a floppy disk, or an optical medium such as a compact disk (CD) or DVD (digital versatile disk), flash memory, and the like. The computer readable medium may be any combination of such storage or transmission devices.

Such programs may also be encoded and transmitted using carrier signals adapted for transmission via wired, optical, and/or wireless networks conforming to a variety of protocols, including the Internet. As such, a computer readable medium may be created using a data signal encoded with such programs. Computer readable media encoded with the program code may be packaged with a compatible device or provided separately from other devices (e.g., via Internet download). Any such computer readable medium may reside on or within a single computer product (e.g. a hard drive, a CD, or an entire computer system), and may be present on or within different computer products within a system or network. A computer system may include a monitor, printer, or other suitable display for providing any of the results mentioned herein to a user.

Any of the methods described herein may be totally or partially performed with a computer system including one or more processors, which can be configured to perform the steps. Thus, embodiments can be directed to computer systems configured to perform the steps of any of the methods described herein, potentially with different components performing a respective steps or a respective group of steps. Although presented as numbered steps, steps of methods herein can be performed at a same time or in a different order. Additionally, portions of these steps may be used with portions of other steps from other methods. Also, all or portions of a step may be optional. Additionally, any of the steps of any of the methods can be performed with modules, units, circuits, or other means for performing these steps.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of example embodiments of the invention has been presented for the purposes of illustration and description. It is not intended to be exhaustive or to limit the invention to the precise form described, and many modifications and variations are possible in light of the teaching above.

A recitation of "a", "an" or "the" is intended to mean "one or more" unless specifically indicated to the contrary. The use of "or" is intended to mean an "inclusive or," and not an "exclusive or" unless specifically indicated to the contrary. Reference to a "first" component does not necessarily require that a second component be provided. Moreover reference to a "first" or a "second" component does not limit the referenced component to a particular location unless expressly stated.

All patents, patent applications, publications, and descriptions mentioned herein are incorporated by reference in their entirety for all purposes. None is admitted to be prior art.

What is claimed is:

1. A method comprising:
   a) generating, by a central processing unit, an initial graph from a plurality of initial known data sets;
   b) determining, by the central processing unit, a plurality of subgraphs from the initial graph;
   c) inputting, the plurality of subgraphs into a processing unit system comprising a plurality of processing units;
   d) executing, in each of the plurality of processing units, a learning process on a subgraph to identify communities within the subgraph, each community comprising a plurality of nodes and edges, wherein the nodes in the each community share one or more common characteristics, and wherein the identified communities are respectively defined by different distinct characteristics and have different community identifiers;
   e) distributing, by the central processing unit, the communities and the different community identifiers identified in step d) to the plurality of processing units;
   f) executing, in each of the plurality of processing units, a merge process for communities comprising common nodes received by the processing unit based on similarity to produce a new community from the merged communities or derivatives of the merged communities, the new community comprising at least the common nodes, the new community capable of being used to classify an unknown data set;
   g) in each of the processing units, assigning a new community identifier to the new community and deleting the communities used to form the new community from memory;
   h) receiving a request comprising the unknown data set; and
   i) determining an output node from a model including one or more of the new communities from the plurality of processing units using the unknown data set.

2. The method of claim 1, wherein the learning process is an unsupervised learning process.

3. The method of claim 1, wherein the derivatives are trees formed from the merged communities, and wherein the method further comprises:
   forming, in each of the processing units, trees from each of the merged communities.

4. The method of claim 3, wherein the plurality of subgraphs are random overlapping samples generated using a Poisson distribution.

5. The method of claim 3, wherein f) further comprises:
   calculating, in each of the plurality of processing units, a normalized overlap score between two or more communities; and
   merging, in each of the plurality of processing units, the two or more communities based on the normalized overlap score, and wherein the method further comprises
   gathering, by the central processing unit, the merged communities from each of the plurality of processing units;
   evaluating, by the central processing unit, a file size of the merged communities; and
   stopping or repeating f) based on the evaluated file size of the merged communities.

6. The method of claim 5, further comprising:
   distributing, by the central processing unit, the merged communities to the plurality of processing units; and repeating f).

7. The method of claim 6, wherein the merged communities are distributed to the plurality of processing units according to a Poisson distribution.

8. The method of claim 1, wherein the nodes comprise entity names.

9. The method of claim 8, further comprising:
   calculating, in the each of the plurality of processing units, a vector similarity score for the merged communities based on a comparison of the merged communities and an updated graph from the plurality of initial known data sets and a plurality of new known data sets.

10. The method of claim 9, wherein the plurality of initial known data sets and the plurality of new known data sets comprise a history of interactions conducted over a network.

11. A method comprising:
    providing, by one or more user devices, a plurality of known data sets to a model build system comprising a central processing unit and a plurality of processing units, wherein the central processing unit generates an initial graph from a plurality of initial known data sets, determines a plurality of subgraphs from the initial graph, inputs the plurality of subgraphs into the plurality of processing units, and wherein each of the plurality of processing units executes a learning process on a subgraph to identify communities within the subgraph, each community comprising a plurality of nodes and edges, wherein the nodes in the each community share one or more common characteristics, and wherein the identified communities are respectively defined by different distinct characteristics and have different community identifiers, and the central processing unit distributes the communities and the different community identifiers to the plurality of processing units, and wherein each of the plurality of processing units executes a merge process for communities comprising common nodes received by the processing unit based on similarity to produce a new community from the merged communities or derivatives of the merged communities, the new community comprising at least the common nodes, the new community capable of being used to classify an unknown data set, and assigns a new community identifier to the new community and deletes the communities used to form the new community from memory;
    providing, by the one or more user devices to the model build system, a request comprising the unknown data set, wherein the model build system determines one or more output nodes from a model including one or more of the new communities from the plurality of processing units using the unknown data set; and
    receiving, by the one or more user devices, the one or more output nodes.

12. The method of claim 11, wherein the plurality of processing units comprise graphics processing units.

13. The method of claim 11, wherein the learning process is an unsupervised learning process.

14. The method of claim 11, wherein the derivatives are trees formed from the merged communities, and wherein in each of the processing units, trees from each of the merged communities are formed.

15. The method of claim 11, wherein the plurality of subgraphs are random overlapping samples generated using a Poisson distribution.

16. The method of claim 11, wherein the plurality of initial known data sets and a plurality of new known data sets comprise a history of interactions conducted over a network.

17. A user device comprising:

one or more processors; and one or more computer readable media, the one or more computer readable media comprising code, executable by the one or more processors to implement operations comprising:

providing, by the user device, a plurality of known data sets to a model build system comprising a central processing unit and a plurality of processing units, wherein the central processing unit generates an initial graph from a plurality of initial known data sets, determines a plurality of subgraphs from the initial graph, inputs the plurality of subgraphs into the plurality of processing units, and wherein each of the plurality of processing units executes a learning process on a subgraph to identify communities within the subgraph, each community comprising a plurality of nodes and edges, wherein the nodes in the each community share one or more common characteristics, and wherein the identified communities are respectively defined by different distinct characteristics and have different community identifiers, and the central processing unit distributes the communities and the different community identifiers to the plurality of processing units, and wherein each of the plurality of processing units executes a merge process for communities comprising common nodes received by the processing unit based on similarity to produce a new community from the merged communities or derivatives of the merged communities, the new community comprising at least the common nodes, the new community capable of being used to classify an unknown data set, and assigns a new community identifier to the new community and deletes the communities used to form the new community from memory;

providing, by the user device to the model build system, a request comprising the unknown data set, wherein the model build system determines one or more output node from a model including one or more of the new communities from the plurality of processing units using the unknown data set; and receiving, by the user device, the one or more output nodes.

18. The user device of claim 17, wherein the learning process is an unsupervised learning process.

19. The user device of claim 17, wherein the user device is a laptop computer.

20. The user device of claim 17, wherein the plurality of initial known data sets and a plurality of new known data sets comprise a history of interactions conducted over a network.

* * * * *